United States Patent
Maekawa et al.

(10) Patent No.: US 6,890,848 B2
(45) Date of Patent: May 10, 2005

(54) FABRICATION PROCESS OF A SEMICONDUCTOR DEVICE

(75) Inventors: Kaoru Maekawa, Nirasaki (JP); Satohiko Hoshino, Nirasaki (JP); Masahito Sugiura, Nirasaki (JP); Federica Allegretti, Crawley (GB)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/069,274

(22) PCT Filed: Jun. 28, 2001

(86) PCT No.: PCT/JP01/05578

§ 371 (c)(1),
(2), (4) Date: Jun. 11, 2002

(87) PCT Pub. No.: WO02/03442

PCT Pub. Date: Jan. 10, 2002

(65) Prior Publication Data

US 2002/0164869 A1 Nov. 7, 2002

(30) Foreign Application Priority Data

Jun. 30, 2000 (JP) ........................................ 2000-199736

(51) Int. Cl.[7] .......................................... H01L 21/4763
(52) U.S. Cl. ........................ 438/624; 438/637; 438/638
(58) Field of Search ................................ 438/782, 624, 438/637, 638, 700, 761, 781; 257/751

(56) References Cited

U.S. PATENT DOCUMENTS

| | | | | |
|---|---|---|---|---|
| 5,972,803 A | * | 10/1999 | Shu et al. | 438/781 |
| 6,083,850 A | * | 7/2000 | Shields | 438/763 |
| 6,114,766 A | * | 9/2000 | Shields | 257/758 |
| 6,133,137 A | * | 10/2000 | Usami | 438/622 |
| 6,153,511 A | * | 11/2000 | Watatani | 438/623 |
| 6,452,274 B1 | | 9/2002 | Hasegawa et al. | |
| 6,521,548 B2 | * | 2/2003 | Jeng | 438/782 |
| 6,558,756 B2 | * | 5/2003 | Sugahara et al. | 427/490 |

FOREIGN PATENT DOCUMENTS

| | | |
|---|---|---|
| EP | 0 899 780 A2 | 3/1999 |
| EP | 0 917 184 A2 | 5/1999 |
| JP | 10064995 | 3/1998 |
| JP | 2000021873 | 1/2000 |
| JP | 2000294633 | 10/2000 |
| JP | 2001044189 | 2/2001 |
| JP | 20001044191 | 2/2001 |

* cited by examiner

*Primary Examiner*—Phat X. Cao
*Assistant Examiner*—Theresa T. Doan
(74) *Attorney, Agent, or Firm*—Pillsbury Winthrop LLP

(57) ABSTRACT

A method of fabricating a semiconductor device includes the steps of forming a first insulation film on a substrate by a spin-on process, applying a curing process to the first insulation film at a temperature of 380-500° C. over a duration of 5-180 seconds, and forming a second insulation film on the first insulation film by a spin-on process.

25 Claims, 6 Drawing Sheets

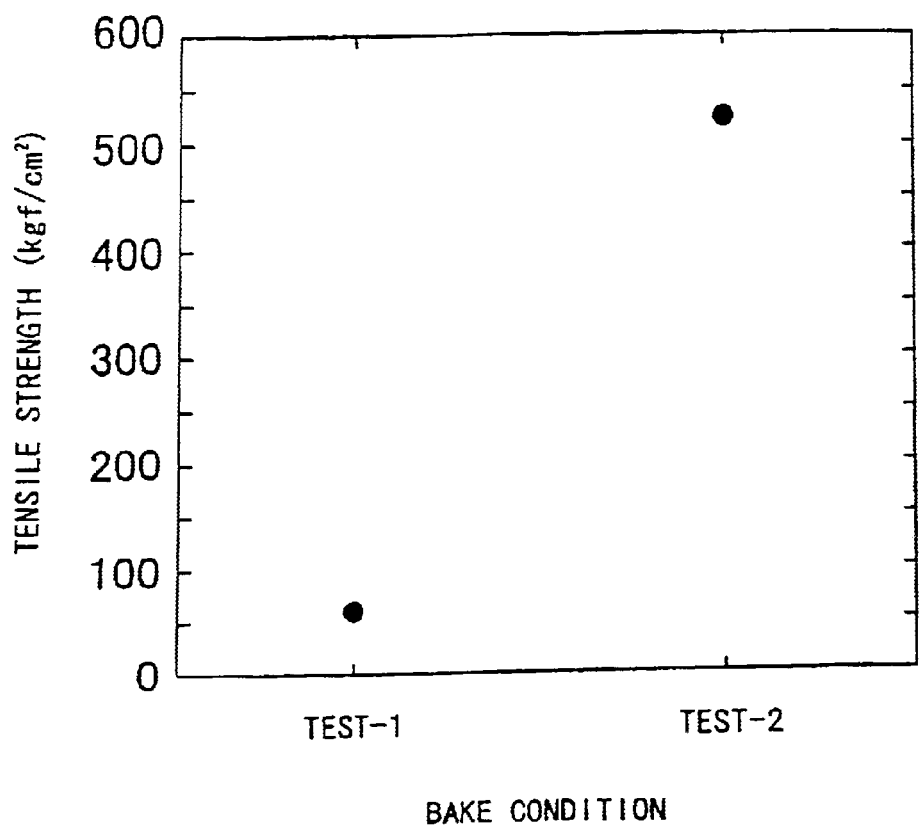

Primary Bake

Primary Cure

Secondary Bake

Secondary Cure

↓ Primary Bake

↓ Primary Cure

↓

↓ Secondary Bake

↓ Secondary Cure

FABRICATION PROCESS OF A SEMICONDUCTOR DEVICE

This application is the National Phase of International Application PCT/JP01/05578, which was filed on Jun. 28, 2001 and which designated the U.S. and that International Application was published under PCT Article 21(2) in English.

BACKGROUND OF THE INVENTION

The present invention generally relates to semiconductor devices and more particularly to a fabrication process of a semiconductor device having a multilayer interconnection structure that uses a low-dielectric organic spin-on insulation film for an interlayer insulation film.

In the art of high-resolution lithography, leading-edge semiconductor integrated circuit devices include an enormous number of semiconductor devices on a substrate. In such advanced semiconductor integrated circuit devices, the use of a single interconnection layer is not sufficient for interconnecting the semiconductor devices on the substrate, and it is common to provide a multilayer interconnection structure on the substrate, wherein a multilayer interconnection structure includes a plurality of interconnection layers stacked with each other with intervening interlayer insulating films.

Particularly, there is an intensive effort made with regard to the so-called dual-damascene process in the art of multilayer interconnection structure in which a typical dual-damascene process includes the steps of forming grooves and contact holes in an interlayer insulating film in correspondence to the interconnection patterns to be formed, and filling the grooves and the contact holes by a conducting material to form the desired interconnection pattern.

While there exist various modifications in the dual-damascene process, the processes in FIGS. 1A–1F represent a typical conventional dual-damascene process used for forming a multilayer interconnection structure.

Referring to FIG. 1A, a Si substrate 10, carrying thereon various semiconductor device elements such as MOS (Metal-Oxide-Silicon) transistors not illustrated, is covered by an interlayer insulating film 11 such as a CVD (Chemical Vapor Deposition)-$SiO_2$ film, and the interlayer insulating film 11 carries thereon an interconnection pattern 12A. It should be noted that the interconnection pattern 12A is embedded in a next interlayer insulating film 12B formed on the interlayer insulating film 11, and an etching stopper film 13 of SiN, and the like, is provided so as to cover the interconnection pattern 12A and the interlayer insulating film 12B forming an interconnection layer 12. The etching stopper film 13, in turn, is covered by another interlayer insulating film 14, and the interlayer insulating film 14 is covered by another etching stopper film 15.

In the illustrated example, there is a further interlayer insulating film 16 formed on the etching stopper film 15, and the interlayer insulating film 16 is covered by a next etching stopper film 17. The etching stopper films 15 and 17 are also called as "hard mask."

In the step of FIG. 1A, a resist pattern 18 is formed on the etching stopper film 17 with a resist opening 18A formed in correspondence to a desired contact hole by a photolithographic patterning process, and the etching stopper film 17 is removed by a dry etching process while using the resist pattern 18 as a mask. As a result, there is formed an opening corresponding to the desired contact hole in the etching stopper film 17.

Next, in the step of FIG. 1B, the interlayer insulating film 16 underlying the etching stopper film 17 is subjected to a reactive ion etching (RIE) process, and an opening 16A is formed in the interlayer insulating film 16 in correspondence to the desired contact hole. Further, the resist pattern is removed. In the case the interlayer insulation film 16 is an organic film, the resist pattern is removed simultaneously to the step of etching the interlayer insulation film 16 to form the contact hole 16A.

Next, in the step of FIG. 1C, a resist film 19 is formed on the structure of FIG. 1B, and the resist film 19 is patterned subsequently in the step of FIG. 1D by a photolithographic patterning process so as to form a resist opening 19A corresponding to a desired interconnection pattern. As a result of the formation of the resist opening 19A, the opening 16A in the interlayer insulating film 16 is exposed.

In the step of FIG. 1D, the etchings stopper film 17 exposed by the resist opening 19A and the etching stopper film 15 exposed at the bottom of the opening 16A are removed by a dry etching process while using the resist film 19 as a mask, and the interlayer insulating film 16 and the interlayer insulating film 14 are patterned simultaneously in the step of FIG. 1E. As a result of the patterning, there is formed a opening 14A corresponding to the desired interconnection groove in the interlayer insulating film 16. The opening 16B is formed so as to include the opening 16A.

Next, in the step of FIG. 1F, the etching stopper film 13 exposed at the contact hole 14A is removed by an RIE process, causing exposure of the interconnection pattern 12A. After this, the interconnection groove 16A and the opening 14A are filled with a conductor layer such as an Al layer or a Cu layer, wherein the conductor layer is subsequently subjected to a chemical mechanical polishing (CMP) process, to form an interconnection pattern 20 in electrical contact with the underlying interconnection pattern 12A via the contact hole 14A. Interconnection patterns of third and fourth layers can be formed similarly by repeating the foregoing process steps.

Meanwhile, conventional semiconductor devices have achieved large integration density and high performance by miniaturizing the design rule. However, the use of strict design rules invite the problem of increased interconnection resistance and inter-wiring capacitance, and there is emerging a situation in which further improvement of performance is difficult as long as conventional interconnection material is used. Thus, investigations are being made with regard to the use of low-resistance Cu for the interconnection material and further with regard to the use of low-dielectric material for the interlayer insulation film so as to reduce the interconnection capacitance.

Particularly, recent advanced semiconductor integrated circuits tend to construct the multilayer interconnection structure by using Cu having a characteristically low resistance as the material of the interconnection pattern in place of conventionally used Al, in combination with a low-dielectric interlayer insulation film, by way of a damascene process.

In view of the fact that the dual damascene process explained before includes a CMP process, the low-dielectric material used in such a dual damascene process is required to have an excellent mechanical property with regard to shear and compressive stress, and hence adhesion, in addition to the required small inter-wiring capacitance. This mechanical strength is one of the most important factors required for a low-dielectric insulation film used in a dual damascene process.

In the event SiO$_2$ or BPSG is used for the interlayer insulating film as in the case of conventional multilayer interconnection structures, it should be noted that the specific dielectric constant of the interlayer insulating film generally takes a value of 4–5. This value of the specific dielectric constant can be reduced to 3.3–3.6 by using a F (fluorine)-doped SiO$_2$ film called FSG. Further, the value of the specific dielectric constant can be reduced 2.9–3.1 by using an SiO$_2$ film having a Si—H group in the structure thereof such as an HSQ (hydrogen silsesquioxane) film. Further, the use of an organic SOG or organic insulating film is proposed. In the case an organic SOG is used, it becomes possible to reduce the specific dielectric constant to below 3.0. Further, the use of an organic insulating film can realize a still lower specific dielectric constant of about 2.7.

These low-dielectric interlayer insulation films of organic family can be formed either by a pyrolytic CVD process or a plasma CVD process or a spin-on process, wherein the spin-on process has a distinct advantage of large degree of freedom in choosing the solution forming the insulating material over the CVD process, in addition to the advantage of large throughput.

Normally, a spin-coating process starts with a step of setting a silicon substrate on a spin coater and causing a solution to form a film of the low-dielectric interlayer insulation material of organic family on the silicon substrate while spinning the substrate. The silicon substrate is then subjected to a drying process for evaporating the solvent from the film, and a curing process is applied in a heat treatment apparatus, which may be selected from a hot plate, a furnace or a lamp according to the need. As a result of the final thermal curing process, a solvent-insoluble, highly cross-linked insulation film is obtained.

In the case of forming a multilayer interconnection structure by a dual damascene process while using low-resistance Cu, it is important to use a CMP process in view of the difficulty of applying a dry etching process to Cu. In relation to the use of the CMP process, there arises a problem, particularly when an organic insulation film is used, in that the organic insulation film has a poor adhesion characteristic.

SUMMARY OF THE INVENTION

Accordingly, it is a general object of the present invention to provide a novel and useful fabrication process of a semiconductor device wherein the foregoing problems are eliminated.

Another and more specific object of the present invention is to improve the adhesion of a spin-on interlayer insulation film of an organic insulating material used in a multilayer interconnection structure.

Another object of the present invention is to provide a method of fabricating a semiconductor device, comprising the steps of:

forming a first insulation film on a substrate by a spin-on process;

applying a curing process to said first insulation film at a temperature of 380–500° C. over a duration of 5–180 seconds; and forming a second insulation film on said first insulation film by a spin-on process.

Another object of the present invention is to provide a method of fabricating a semiconductor device, comprising the steps of:

forming a first insulation film on a substrate by a spin-on process;

applying a curing process to said first insulation film at a temperature of 380–500° C. over a duration of 5–180 seconds;

forming a second insulation film on said first insulation film by a spin-on process;

patterning said second insulation film to form an opening therein; and etching said first insulation film while using said second insulation film as a mask.

According to the present invention, the adhesion of the low-dielectric organic insulation film of aromatic group is improved by optimizing the curing condition. Thus, by using such an organic insulation film in a multilayer interconnection structure, the yield of the semiconductor device production is improved even though the multilayer interconnection structure is formed by a damascene process that uses a CMP process. By using the organic insulation film of the present invention, it becomes possible to reduce the overall dielectric constant of the multilayer interconnection structure, and the operational speed of the semiconductor device is improved.

Other objects and further features of the present invention will become apparent from the following detailed description when read in conjunction with the attached drawings.

BRIEF DESCRIPTION OF THE DRAWINGS

FIG. 2 is a diagram showing the relationship between the condition of initial baking and a tensile strength of a low-dielectric organic insulation film of aromatic group;

DETAILED DESCRIPTION OF EMBODIMENTS OF THE INVENTION

[Principle]

Figure 1A:
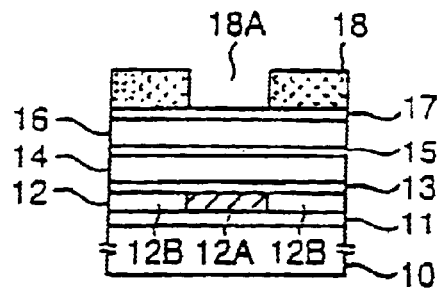
FIGS. 1A–1F are diagrams showing a conventional process for forming a multilayer interconnection structure.
Figure 1B:
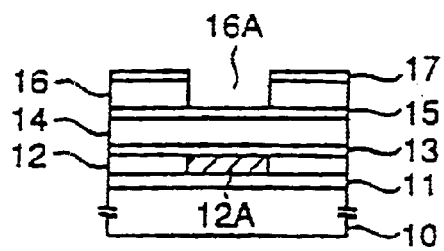
Figure 1C:
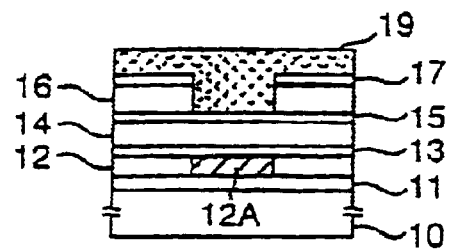
Figure 1D:
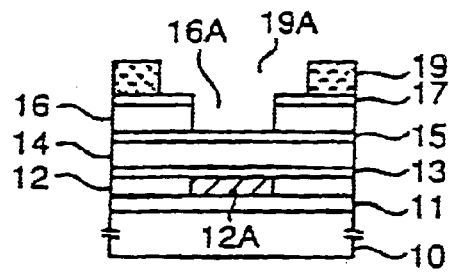
Figure 1E:
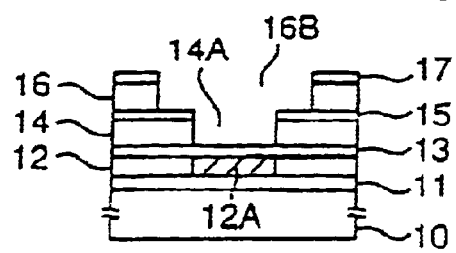
Figure 1F:
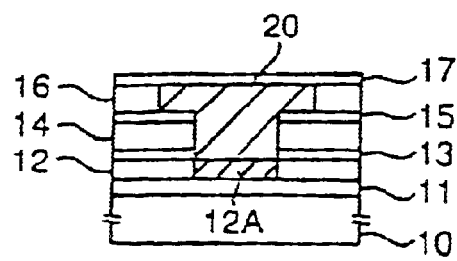

Hereinafter, the experiments conducted by the inventor of the present invention and constituting the foundation of the present invention will be explained.

In the experiments, an adhesion test was conducted on a stacked film structure including spin-on low-dielectric organic insulation films of aromatic group. Generally, "SiLK" (tradename of Dow Corning, Inc.) or "FLARE" (tradename of Honeywell, Inc.) are well known as low-dielectric organic insulation film of aromatic group. Conventionally, a spin-on film is subjected to a baking process for evaporating solvents, followed by a full curing process in a heat treatment apparatus such as hot plate or furnace or lamp, until the film undergoes a full curing.

Hereinafter, the phrase "initial baking" is used to indicate the baking process conducted after formation of a first spin-on insulation film by a spin-on process, while the phrase "initial curing" is used to indicate the curing process applied after the initial baking process. Further, the phrase "subsequent baking" is used to indicate the baking process conducted after formation of a second spin-on insulation film by a spin-on process, while the phrase "subsequent curing" is used to indicate the curing process conducted after the subsequent baking process.

Test-1 (Conventional)

A solution of an organic insulation film of aromatic group is applied on a Si substrate as a first insulation film by using a spin coater, and an initial baking process is applied thereto. Further, an initial curing process is applied in a heat treatment apparatus at 400° C. for 30 minutes. As a result, an organic insulation film of aromatic group is formed on the Si substrate with a specific dielectric constant of 2.65 as the first insulation film.

Next, a solution of a commercially available spin-on insulating film (organic SOG) is applied on the first insulation film thus formed, and a subsequent baking process is conducted. Further, a subsequent curing process is conducted at 400° C. for 30 minutes in a heat treatment apparatus. As a result, an SiNCH film is formed on the first insulation film as the second insulation film.

Test-2

A process similar to the process of TEST-1 was conducted except that the duration of the initial curing process applied to the first insulation film is changed. More specifically, the initial curing process of the first insulation film was conducted in a heat treatment apparatus at 400° C. for 90 seconds.

Peel Test

The multilayer film structure thus obtained by the TEST-1 or TEST-2 was subjected to a tensile test for obtaining the strength of adhesion between the first insulation film and the second insulation film. The tensile test was conducted by attaching the tip end of an aluminum pin to the second insulation film by an epoxy resin and pulling the pin after the epoxy resin is cured. FIG. 2 shows the result of the adhesion test.

As can be seen from FIG. 2, the strength of adhesion is increased when the initial curing process of the first insulation film is conducted under a condition that provides only insufficient curing. While FIG. 2 represents the result obtained for the case in which the first insulation film is formed of an organic insulation film of aromatic group and the second insulation film is formed of SiNCH, a similar result was obtained also in the case the first insulation film is formed of an organic insulation film of aromatic group and the second insulation film is formed of an SiOCH film derived from a generally available organic silane material. Further, a similar result was obtained in the case the first insulation film is formed of an organic insulation film of aromatic group and the second insulation film is formed of an HSQ (hydrogen silsesquioxane) film or an organic insulation film of aromatic group.

FIGS. 3A–3F show the conventional process of stacking spin-on insulation films.

Figure 3A:
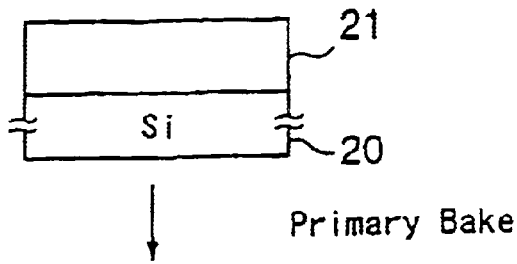
FIGS. 3A–3F are diagrams showing conventional process steps.
Figure 3B:
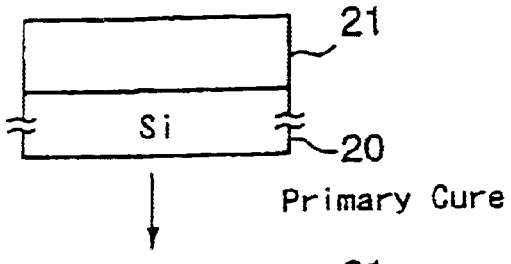

According to the conventional process, a solution containing a target organic insulating material is applied on a Si substrate 20 by a spin coating process in the step of FIG. 3A and an initial baking process is conducted in the step of FIG. 3B so as to evaporate the solvent.

Figure 3C:
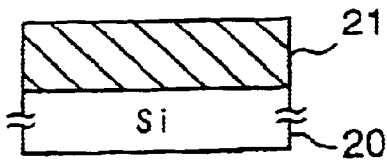

Next, in the step of FIG. 3C, an initial curing process is applied so as to cure the target material completely, and a fully cured film 21 of the target material is formed on the Si substrate 20. Most of the organic films used for forming a multilayer interconnection structure has the nature of thermosetting resin, and the baking process for removing the solvent and the curing process thereafter is sufficient to cause a full curing in the first insulation film.

Figure 3D:
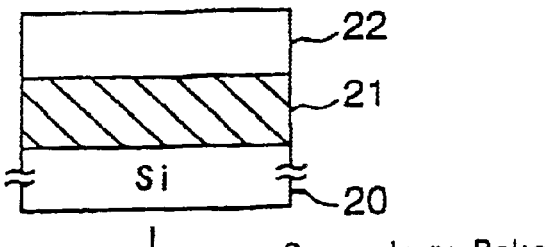
Figure 3E:
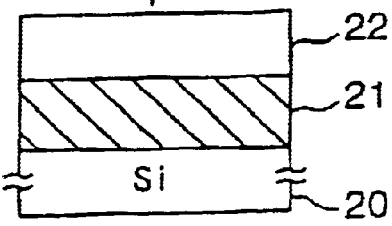
Figure 3F:
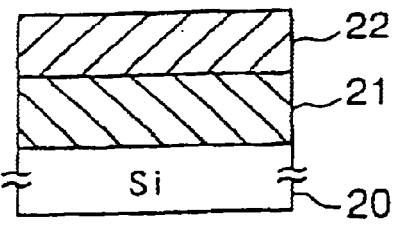

Next, in the step of FIG. 3D, the second insulation film 22 is applied, and after conducting a subsequent baking process in the step of FIG. 3E, a subsequent curing process is conducted in the step of FIG. 3F and a fully cured layered structure of the layers 21 and 22 is obtained.

FIGS. 4A–4F shows the process of the present invention, which is based on the discovery of FIG. 2.

The result of FIG. 2 for the TEST-2 clearly indicates that a far better adhesion is achieved between the insulation films 21 and 22 when the initial curing process of the first insulation film 21 is conducted with thermal energy lower than the thermal energy used in the corresponding initial curing process in the experiment of TEST-1. This means that the degree of curing of the first insulation film 21 after the initial curing process in the TEST-2 would be smaller than the degree of curing achieved in the TEST-1 during the initial curing process, in which no second insulation film 22 is formed on the first insulation film 21. It should be noted that the initial curing process was conducted at 400° C. over the duration of 30 minutes in the experiment of TEST-1, while the initial curing process was conducted at the same temperature over the duration of only 90 seconds in the experiment of TEST-2.

Figure 4A:
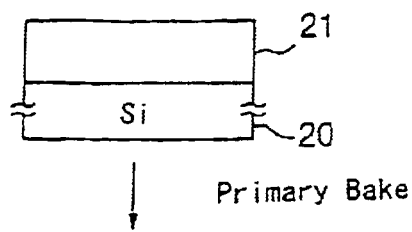
FIGS. 4A–4G are diagrams showing the principle of the present invention.
Figure 4B:
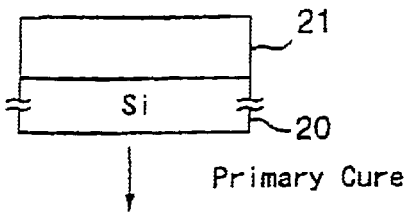

Thus, after the step of FIG. 4A corresponding to the step of FIG. 3A, the first insulation film 21 of the organic insulation film of aromatic group was subjected to an initial curing process in the step of FIG. 4B with lower thermal energy. Thus, the first insulation film 21 is cured only partially, and there are left a number of unreacted sites in the first insulation film 21 when the initial curing process of FIG. 4B is completed.

Figure 4C:
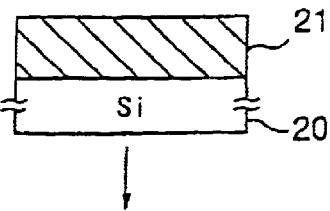
Figure 4D:
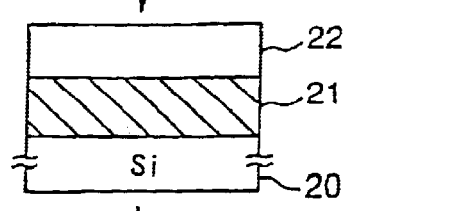
Figure 4E:
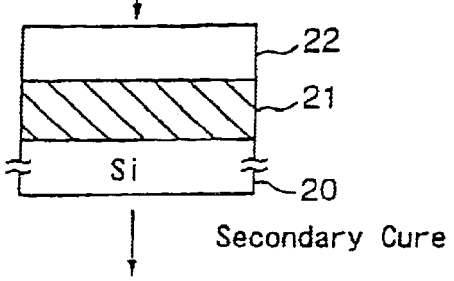
Figure 4F:
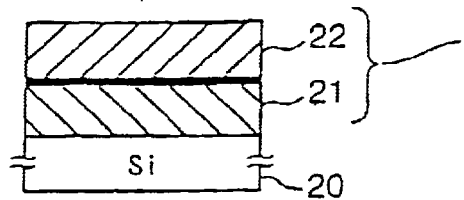
Figure 4G:
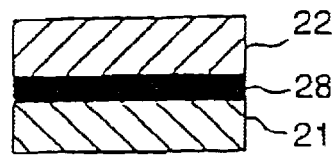

After the step of FIG. 4B, the second insulation film 22 is applied on the first insulation film 21 in the step of FIG. 4C and a subsequent baking process is conducted in the step of FIG. 4D. Further, by conducting a subsequent curing process in the step of FIG. 4E, the unreacted sites in the top part of the first insulation film 21 and the reacted sites existing at the bottom part of the second insulation film 22 cause a reaction, and there is formed an intermixing layer 28 at the interface between the first and second insulation films 21 and 22 as represented in FIG. 4F or FIG. 4G, wherein FIG. 4G shows an enlarged view of FIG. 4F. By conducting the subsequent curing process with increased thermal energy, a stacked structure formed of fully cured films 21 and 22 is obtained.

According to the process of FIGS. 4A–4E, the adhesion between the films 21 and 22 is improved.

Thus, the present invention achieves the desired improvement of adhesion between organic insulation films constituting a stacked insulation structure by causing to form the intermixing layer 28 by controlling the condition of the initial curing process of the first insulation film 21. Thereby, it should be noted that the present invention is not limited to the case in which the first insulation film 21 is formed of an organic insulation film of aromatic group and the second insulation film is formed of an SiNCH film, but is applicable also to the case in which the first insulation film 21 is formed of any of an SiNCH film, an SiOCH film, an organic SOG film, or an HSQ film. Further, the second insulation film 22 may be formed of any of an SiNCH film, an organic insulation film or aromatic group, an SiOCH film, an organic SOG film, or an HSQ film.

Further, a similar result is obtained also in the case there is already formed an interconnection pattern on a substrate.

From the result of the foregoing peeling test, it is concluded that the initial curing process of the first insulation film 21 should be conducted preferably at a temperature between 380–500° C. over a duration of 5–180 seconds, more preferably at a temperature between 380–500° C. over a duration of 10–150 seconds, most preferably at a temperature of 400–470° C. over a duration of 10–150 seconds. Thereby, the upper limit temperature of the initial curing process of the first insulation film 21 is determined from the requirement that there should occur no chemical reaction between the first and second layers when forming the second insulation film 22 except for the reaction that forms the intermixing layer 28. With regard to the duration of the curing process, the duration less than 5 seconds is not suitable for a curing process, while a duration larger than 180 seconds does not provide the desired improvement of the adhesion. Of course, this duration depends on the temperature used for the drying process.

[First Embodiment]

FIGS. 5A–5F show the fabrication process of a semiconductor device having a multilayer interconnection structure according to a first embodiment of the present invention, wherein those parts corresponding to the parts described previously are designated by the same reference numerals and the description thereof will be omitted.

Figure 5A:
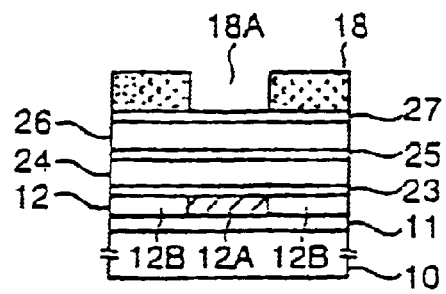
FIGS. 5A–5F are diagrams showing the fabrication process of a semiconductor device according to a first embodiment of the present invention.

Referring to FIG. 5A, the multilayer interconnection structure is constructed on the Si substrate 10 carrying thereon the Cu interconnection pattern 12A via the intervening insulation film 11, wherein the Cu interconnection pattern 12A is embedded in the interlayer insulation film 12B.

On the interlayer insulation film 12, there is provided an etching stopper film 23 of SiOCH by a spin-coating process of a commercially available polysilane film in place of the conventional etching stopper film 13 of SiN, and an interlayer insulation film 24 of a low-dielectric organic insulation material of aromatic group is formed on the etching stopper film 23 by a spin-coating process. Further, an etching stopper film 25 of SiOCH is formed on the interlayer insulation film 24 by a spin-coating process of an organic SOG film, and an interlayer insulation film 26 of a low-dielectric organic insulation material of aromatic group is formed further on the etching stopper film 25 by a spin-coating process. On the interlayer insulation film 26, an etching stopper film 27 of SiNCH is formed by a spin-coating process.

Each time the any of the layers 23–27 is formed by a spin-coating process in the step of FIG. 5A, an initial baking process and an initial curing process are applied consecutively, wherein the initial curing process is conducted at 400° C. for 90 seconds in view of the discovery of FIG. 2. Further, after the layered structure including the layers 23–27 is thus formed, the subsequent curing process is conducted at 400° C. for 30 minutes such that each of the films 23–27 undergoes full curing.

Figure 5B:
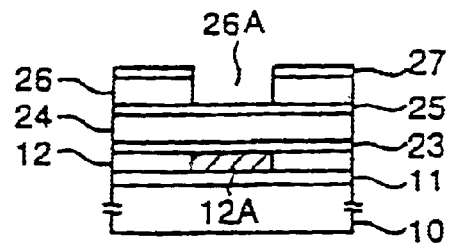

Next, in the step of FIG. 5B, the SiN film 27 is subjected to a dry etching process while using the resist pattern 18 as a mask, and an opening is formed in the SiNCH film 27 in correspondence to the resist opening 18A. It should be noted that the resist opening 18A corresponds to the contact hole to be formed in the multilayer interconnection structure. Further, the resist pattern 18 is removed and the low-dielectric organic insulation film 26 underneath the SiNCH film 27 is subjected to a dry etching process to form an opening 26A in correspondence to the resist opening 18A.

Figure 5C:
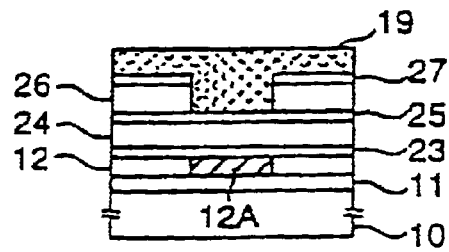
Figure 5D:
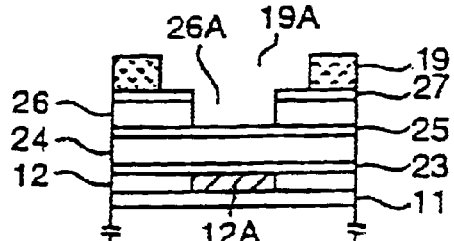

Next, in the step of FIG. 5C, the resist film 19 is formed newly on the structure of FIG. 5B and the resist film 19 is subjected to a photolithographic patterning process in the step of FIG. 5D, to form a resist opening 19A in correspondence to the interconnection groove to be formed in the multilayer interconnection structure. After the resist opening 19A is formed, the SiNCH film 27 and the opening 26A in the low-dielectric insulation film 26 are exposed. Further, the SiOCH film 25 is exposed at the bottom of the opening 26A.

Figure 5E:
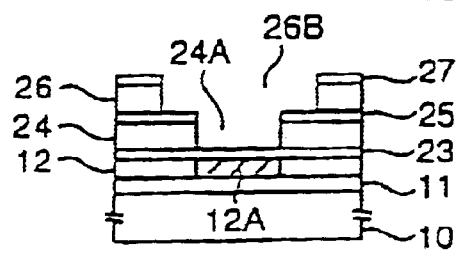

Next, in the step of FIG. 5E, the SiNCH film 27 exposed at the resist opening 19A is removed by a dry etching process while using the resist 19 as a mask. By conducting the dry etching process, the SiOCH film 25 exposed at the bottom of the opening 26A is removed simultaneously, and the interlayer insulation film 24 is exposed.

Further, in the step of FIG. 5E, a dry etching process is applied to the structure thus obtained and there is formed an opening 26B in the interlayer insulation film 26 in correspondence to the resist opening 19A and hence the interconnection groove to be formed. It should be noted thereby that the opening 26B is formed so as to include the opening 26A. Simultaneously to the formation of the opening 26B, there is formed an opening 24A in the interlayer insulation film 24 in correspondence to the opening 26A and hence the contact hole to be formed.

Figure 5F:
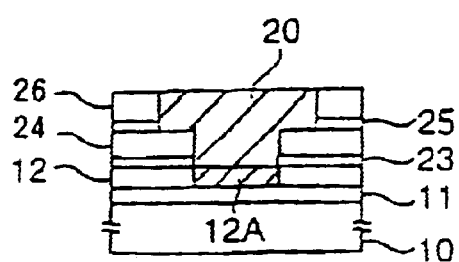

Further, in the step of FIG. 5F, the SiNCH film 27 on the interlayer insulation film 26, the SiOCH film 25 exposed at the opening 26B and the SiOCH film 23 exposed at the opening 24A are removed by conducting a dry etching process, and the desired multilayer interconnection structure is obtained by filling the interconnection groove provided by the opening 26B and the contact hole provided by the opening 24A by a conductive layer of Cu.

For the interlayer insulation films 24 and 26, it is possible to use an SiNCH film, an SiOCH film, an HSQ film such as an SiOH film, or an organic SOG film. Further, the etching stopper films 23, 25 and 27 may be formed of a low-dielectric organic insulation film, an HSQ film such as an SiOH film or an organic SOG film. The multilayer interconnection structure of the present invention can reduce the overall dielectric constant and contributes to the improvement of operational speed of the semiconductor device.

[First Comparative Experiment]

In the first comparative experiment, a multilayer interconnection structure similar to the structure of the first embodiment was formed according to the process similar to that of FIGS. 5A–5F except that the initial curing process was conducted at the temperature of 400° C. over the duration of 30 minutes.

The evaluation over the multilayer interconnection structure of this comparative experiment will be made later.

[Second Embodiment]

FIGS. 6A–6E are diagrams showing the fabrication process of a semiconductor device having a multilayer interconnection structure according to the second embodiment of the present invention, wherein those parts corresponding to the parts described previously are designated by the same reference numerals and the description thereof will be omitted. The multilayer interconnection structure of the present embodiment uses a so-called dual-hard mask construction.

Figure 6A:
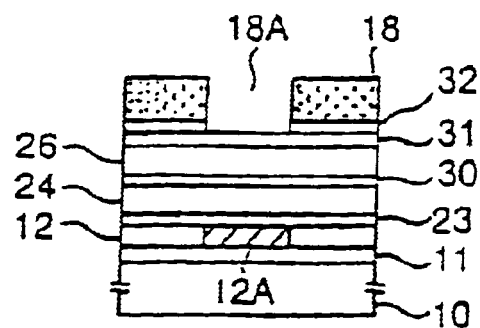
FIGS. 6A–6E are diagrams showing the fabrication process of a semiconductor device according to a second embodiment of the present invention.

Referring to FIG. 6A, the multilayer interconnection structure is constructed on the Si substrate 10 carrying thereon the Cu interconnection pattern 12A via the intervening insulation film 11, wherein the Cu interconnection pattern 12A is embedded in the interlayer insulation film 12.

On the interlayer insulation film 12, the etching stopper film 23 of SiOCH is formed by a spin-coating process, and the interlayer insulation film 24 of a low-dielectric organic insulation material of aromatic group is formed on the etching stopper film 12 by a spin-coating process. Further, an etching stopper film 30 of SiOCH is formed on the interlayer insulation film 24 by a spin-coating process, and the interlayer insulation film 26 of a low-dielectric organic insulation material of aromatic group is formed further on the etching stopper film 30 by a spin-coating process. On the interlayer insulation film 26, an etching stopper film 31 of SiOCH and an SiO₂ film 32 are formed consecutively by a spin-coating process. The etching stopper films 31 and 32 constitute a so-called dual-hard mask structure.

Each time the any of the layers 23, 24, 26, 30 and 31 is formed by a spin-coating process in the step of FIG. 5A, an initial baking process and an initial curing process are applied consecutively, wherein the initial curing process is conducted at 400° C. for 90 seconds in view of the discovery of FIG. 2. Further, after the layered structure including the layers 23, 24, 26, 30 and 31 is thus formed, the subsequent curing process is conducted at 400° C. for 30 minutes such that each of the films undergoes full curing.

In the step of FIG. 6A, the resist film 18 is provided on the SiO₂ film 32 in the step of FIG. 6A, wherein the resist film 18 includes the resist opening 18A exposing the SiO₂ film 32, and there is formed an opening through the SiO₂ layer 32 in correspondence to the resist opening 18A so as to expose the SiOCH layer 31.

Figure 6B:
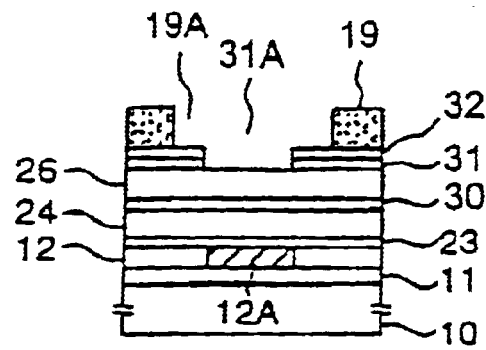

Next, in the step of FIG. 6B, the SiOCH film 31 is patterned and there is formed an opening 31A in correspondence to the resist opening film 18A such that the opening 31A exposes the interlayer insulation film 26. Further, the resist film 18 is removed and another resist film 19 is provided with a resist opening 19A corresponding to the desired interconnection groove, and the SiO₂ film 32 is patterned in the step of FIG. 6C while using the resist film 19 as a mask. As a result, there is formed an opening 32A in the SiO₂ film 32 in correspondence to the resist opening 19A, and hence in correspondence to the desired interconnection groove, such that the opening 32A exposes the SiOCH film 31.

Figure 6C:
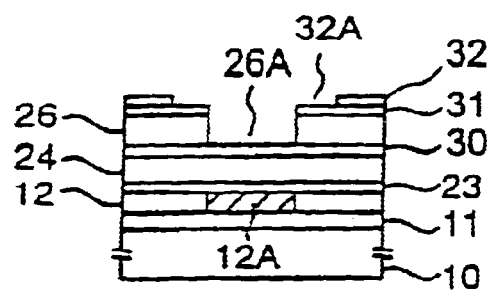

During the step of patterning the SiO₂ film 32 in the step of FIG. 6C, the exposed part of the interlayer insulation film 26 is patterned simultaneously, and there is formed an opening 26A in the interlayer insulation film 26 in correspondence to the opening 31A such that the opening 26A exposes the SiOCH film 30. In this process, it should be noted that the SiOCH film 31 acts as hard mask.

Figure 6D:
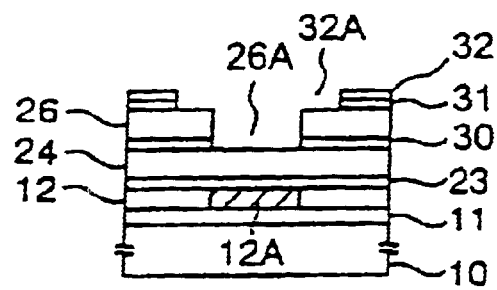

Next, in the step of FIG. 6D, the SiOCH film 32 exposed at the opening 32A and the SiOCH film 30 exposed at the opening 26A are patterned simultaneously, such that the interlayer insulation film 26 is exposed at the opening 32A and the interlayer insulation film 24 is exposed at the opening 26A.

Figure 6E:
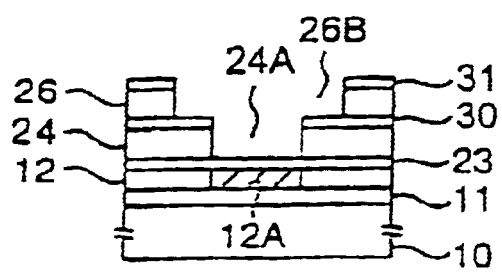

Next, in the step of FIG. 6E, the SiO₂ film 32 remaining on the SiOCH film 31 is removed, and the interlayer insulation film 26 exposed at the opening 32A is removed together with the interlayer insulation film 24 exposed at the opening 26A. As a result, an opening 26B is formed in the interlayer insulation film 26 in correspondence to the opening 32A, and hence in correspondence to the desired interconnection pattern, simultaneously with an opening 24A formed in the interlayer insulation film 24 in correspondence to the opening 26A.

By removing the remaining SiOCH film 23 and filling the openings 24A and 26B by Cu, the desired multilayer interconnection pattern is formed on the Si substrate 10.

In the present embodiment, it is possible to use any of an SiNCH film, an SiOCH film, an HSQ film such as an SiOH film or an organic SOG film for the interlayer insulation films 24 and 26. Further, it is possible to use a low-dielectric organic insulation film, an SiNCH film, an HSQ film such as an SiOH film, or an organic SOG film for the etching stopper films 23, 30 and 31.

The multilayer interconnection structure of the present embodiment is characterized by a small overall dielectric constant and contributes to the improvement of operational speed of the semiconductor device.

[Second Comparative Experiment]

In a second comparative experiment, a multilayer interconnection structure similar to the multilayer interconnection structure of the second embodiment was prepared while conducting the initial curing process at 400° C. for 30 minutes each time the spin-on layers 23–31 are formed after the initial baking process.

The evaluation of the second comparative experiment will be made below.

[CMP Test]

The inventor of the present invention has conducted experiments for removing a Cu layer deposited on the multilayer interconnection structures of the first and second embodiments by a CMP process. Further, the inventor has conducted experiments for removing a Cu layer from the multilayer interconnection structures of the first and second comparative experiments, also by conducting a CMP process.

According to the experiments, it was confirmed that no cracking or peeling of interlayer insulation film occurs in the multilayer interconnection structures of the first and second embodiments of the present invention, while occurrence of peeling of interlayer insulation film was observed in the multilayer interconnection structures of the fist and second comparative experiments.

Summarizing above, the present invention improves the adhesion of spin-on, low-dielectric interlayer insulation films forming a multilayer interconnection structure, by optimizing the condition of the initial curing process.

Further, the present invention is not limited to the embodiments described heretofore, but various variations and modifications may be made without departing from the scope of the invention.

INDUSTRIAL APPLICABILITY

According to the present invention, adhesion of spin-on, low-dielectric interlayer insulation films forming a multilayer interconnection structure is improved by optimizing the initial curing process. Thereby, it becomes possible to fabricate high-speed semiconductor devices and integrated circuits with improved yield of production.

What is claimed is:

1. A method of fabricating a semiconductor device, comprising:

forming a first in insulation film on a substrate by a spin-on process;

partially curing said first insulation film by applying a first thermal energy corresponding to a temperature of 380–500° C. over a duration of 5–180 seconds;

forming a second insulation film directly on said first insulation film by a spin-on process; and completely curing said first insulation film and said second insulation film by applying a second thermal energy larger than said first thermal energy.

2. The method as claimed in claim 1, wherein said first insulation film comprises an organic material having a specific dielectric constant of 3.0 or less.

3. The method as claimed in claim 1, wherein said first insulation film comprises an organic material of aromatic group.

4. The method as claimed in claim 1, wherein said first insulation film is formed of a spin-on film selected from the group consisting of an SiNCH film, an SiOCH film, an organic SOG film, and an HSQ film.

5. The method as claimed in claim 1, wherein said second insulation film comprises an organic material having a specific dielectric constant of 3.0 or less.

6. The method as claimed in claim 1, wherein said second insulation film comprises an organic material of aromatic group.

7. The method as claimed in claim 1 wherein said second insulation film is formed of a spin-on turn selected from the group consisting of an SiNCH film, an SiOCH film, an organic SOG film, and an HSQ film.

8. The method as claimed in claim 1, wherein said partial curing process is conducted at a temperature between 380–500° C. over a duration of 10–150 seconds.

9. The method as claimed in claim 1, wherein partial said curing process is conducted at a temperature between 400–470° C. over a duration of 10–150 seconds.

10. A method of fabricating a semiconductor device, comprising:

forming a first insulation film on a substrate by a spin-on process;

partially curing said first insulation film by applying a first thermal energy corresponding to a temperature of 380–500° C. over a duration of 5–180 seconds;

forming a second insulation film directly on said first insulation film by a spin-on process;

completely curing said first insulation film and said second insulation film by applying a second thermal energy larger than said first thermal energy.

patterning said second insulation film to form an opening therein; and etching said first insulation film while using said second insulation film as a mask.

11. The method as claimed in claim 10, wherein said first insulation film comprises an organic material having a specific dielectric constant of 3.0 or less.

12. The method as claimed in claim 10, wherein said first insulation turn comprises an organic material of aromatic group.

13. The method as claimed in claim 10, wherein said first insulation film is formed of a spin-on film selected from the group consisting of an SiNCH film, an SiOCH film, an organic SOG film, and an HSQ film.

14. The method as claimed in claim 10, wherein said second insulation film comprises an organic material having a specific dielectric constant of 3.0 or less.

15. The method as claimed in claim 10, wherein said second insulation film comprises an organic material of aromatic group.

16. The method as claimed in claim 10, wherein said second insulation film is formed of a spin-on film selected from the group consisting of an SiNCH film, an SiOCH film, an organic SOG film, and an HSQ film.

17. The method as claimed in claim 10, wherein said partial curing process is conducted at a temperature between 380–500° C. over a duration of 10–150 seconds.

18. The method as claimed in claim 10, wherein said partial curing process is conducted at a temperature between 400–470° C. over a duration of 10–150 seconds.

19. A method of fabricating a semiconductor device having a layered structure including plurality of insulation layers, comprising:

partially curing a first insulation layer forming one of said plurality of insulation layers by applying a first thermal energy corresponding to a temperature of 380–500° C. over a duration of a 5–180 seconds;

forming one or more insulation layers constituting said plurality of insulation layers on said first insulation layer to form said layered structure such that at least said first insulation layer and a next insulation layer make direct contact with each other; and completely curing said layered structure by applying a second thermal energy larger than said first thermal energy.

20. The method as claimed in claim 19, wherein said layered structure includes insulation films that comprise organic material having a specific dielectric constant of 3.0 or less.

21. The method as claimed in claim 19, wherein said insulation films comprise organic material of aromatic group.

22. The method as claimed in claim 19, wherein said insulation films are formed of a spin-oil film selected from the group consisting of an SiNCH film, an SiOCH film, an organic SOG film, and an HSQ film.

23. The method as claimed in claim 19, wherein said partial curing process is conducted at a temperature between 380–500° C. over a duration of 10–150 seconds.

24. The method as claimed in claim 19, wherein said partial curing process is conducted at a temperature between 400–470° C. over a duration of 10–150 seconds.

25. The method as claimed in claim 19, wherein said complete curing process is conducted such that there is formed an intermixing layer between said insulation films forming said layered structure.

* * * * *